United States Patent
Cioban et al.

(10) Patent No.: US 10,901,030 B2
(45) Date of Patent: Jan. 26, 2021

(54) VISCOELASTIC PAD UPON INTEGRATED CIRCUIT DEVICE CONTACT FOR MULTIPASS ELECTRICAL CHARACTERIZATION PROBE TESTING

(71) Applicant: International Business Machines Corporation, Armonk, NY (US)

(72) Inventors: Max S. Cioban, Wappingers Falls, NY (US); Jonathan Fry, Fishkill, NY (US); Michael Rizzolo, Delmar, NY (US); Tuhin Sinha, Oradell, NJ (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 16/278,905

(22) Filed: Feb. 19, 2019

(65) Prior Publication Data
US 2020/0264230 A1    Aug. 20, 2020

(51) Int. Cl.
*G01R 31/28* (2006.01)
*G01R 3/00* (2006.01)
*G01R 1/073* (2006.01)

(52) U.S. Cl.
CPC ..... *G01R 31/2889* (2013.01); *G01R 1/07378* (2013.01); *G01R 3/00* (2013.01); *G01R 31/2884* (2013.01)

(58) Field of Classification Search
CPC .. G01R 31/2889; G01R 1/07378; G01R 3/00; G01R 31/2884
See application file for complete search history.

(56) References Cited

U.S. PATENT DOCUMENTS

| | | |
|---|---|---|
| 5,773,987 A | 6/1998 | Montoya |
| 6,166,556 A | 12/2000 | Wang et al. |
| 6,329,829 B1 | 12/2001 | Farnworth et al. |
| 6,333,638 B1 | 12/2001 | Fukasawa et al. |
| 6,529,026 B1 | 3/2003 | Farnworth et al. |
| 6,552,555 B1 | 4/2003 | Nuytkens et al. |
| 7,456,504 B2 | 11/2008 | Hamren et al. |

(Continued)

FOREIGN PATENT DOCUMENTS

CN    102024775 A    4/2011

OTHER PUBLICATIONS

Yaglioglu et al., "Direct Connection and Testing of TSV and Microbump Devices using NanoPierce(TM) Contactor for 3D-IC Integration", 2012 IEEE 30th VLSI Test Symposium (VTS) (Year: 2012).*

*Primary Examiner* — Christopher E Mahoney
(74) *Attorney, Agent, or Firm* — ZIP Group PLLC

(57) ABSTRACT

An integrated circuit (IC) device, such as a wafer, die, or the like, includes a viscoelastic pad upon a contact. The viscoelastic pad includes a viscoelastic material and an electrically conductive material within the viscoelastic material. The viscoelastic pad provides for a probe needle of an IC device tester to be electrically connected to the IC device contact without the probe needle directly contacting the IC device contact. The viscoelastic pad may be probed multiple instances by the probe needle and may be washed or otherwise removed from the IC device after testing is completed. The viscoelastic pad may be formed upon the IC device by forming the viscoelastic material within a mask, aligning the viscoelastic pad to the IC device contact, and ejecting the viscoelastic material from the mask upon the IC device contact.

20 Claims, 8 Drawing Sheets

(56) References Cited

U.S. PATENT DOCUMENTS

| | | | |
|---|---|---|---|
| 9,176,167 B1* | 11/2015 | Chen | G01R 31/2648 |
| 9,269,642 B2 | 2/2016 | Coster et al. | |
| 2007/0040245 A1 | 2/2007 | Seno et al. | |
| 2007/0180923 A1* | 8/2007 | Liu | H01G 5/0136 |
| | | | 73/780 |
| 2011/0103020 A1* | 5/2011 | Dangelo | H01L 23/473 |
| | | | 361/709 |
| 2011/0156712 A1* | 6/2011 | Shankar | G01R 31/31702 |
| | | | 324/415 |
| 2013/0285232 A1* | 10/2013 | Ha | H05K 3/325 |
| | | | 257/696 |
| 2014/0367684 A1 | 12/2014 | Coster et al. | |

* cited by examiner

VISCOELASTIC PAD UPON INTEGRATED CIRCUIT DEVICE CONTACT FOR MULTIPASS ELECTRICAL CHARACTERIZATION PROBE TESTING

FIELD

Embodiments of invention generally relate to integrated circuit (IC) devices, such as dies, wafers, or the like, and IC device testers, such as a wafer prober, that include probe needles. More particularly, embodiments relate to fabricating a viscoelastic pad upon an IC device contact and testing the IC device contact by probing the viscoelastic pad with the probe needle.

BACKGROUND

An IC device tester is a system used for electrical testing of IC devices. Test signals from the IC device tester are transmitted to the IC device by way of one or more probe needles and the test signals are then returned from the IC device for analysis. After the test, the probe needle(s) are forced away from contacts of the IC device.

In some instances, the probe needle causes damage to the contact or contact stack (e.g., C4 solder ball, or the like) which may or may not be repaired. Consequently, this electrical testing typically is conducted only a few instances, leaving no margin for error and little room for follow up tests.

SUMMARY

In an embodiment of the present invention, a method of testing an integrated circuit (IC) device is presented. The method includes inserting a probe needle into a viscoelastic pad that is directly upon a contact of the IC device without contacting the probe needle with the contact. The method includes passing an incoming electrical signal from the probe needle though the viscoelastic pad to the contact. The method includes receiving a return electrical signal from the contact though the viscoelastic pad to the probe needle. The method further includes removing the probe needle from the viscoelastic pad and removing the viscoelastic pad from the contact of the IC device.

In an embodiment of the present invention, a method of fabricating an integrated circuit (IC) device is presented. The method includes forming a viscoelastic pad within a recess of a mask. The method includes aligning the viscoelastic pad within the mask with a contact of the IC device. The method further includes ejecting the viscoelastic pad from the recess of the mask and onto the aligned contact of the IC device. The method further includes inserting a probe needle into the ejected viscoelastic pad without contacting the probe needle with the contact. The method further includes passing an incoming electrical signal from the probe needle though the viscoelastic pad to the contact and receiving a return electrical signal from the contact though the viscoelastic pad to the probe needle. The method further includes removing the probe needle from the viscoelastic pad and removing the viscoelastic pad from the contact of the IC device.

In yet another embodiment of the present invention, a system to test an integrated circuit (IC) device is presented. The system includes an IC device that includes a contact and a viscoelastic pad directly thereupon. The system further includes a probe needle configured to insert into the viscoelastic pad without contacting the contact, configured to pass an incoming electrical signal though the viscoelastic pad to the contact, and configured to receive a return electrical signal from the contact though the viscoelastic pad.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention relate to an IC device that includes a viscoelastic pad upon a contact. The viscoelastic pad includes a viscoelastic material and an electrically conductive material within the viscoelastic material. The viscoelastic pad provides for a probe needle of an IC device tester to be electrically connected to the IC device contact without the probe needle directly contacting the IC device contact. The viscoelastic pad may be probed multiple instances by the probe needle and may be washed or otherwise removed from the IC device after testing is completed. The viscoelastic pad may be formed upon the IC device by forming the viscoelastic material within a mask, aligning the viscoelastic pad to the IC device contact, and ejecting the viscoelastic pad from the mask upon the IC device contact.

Referring now to the figures, wherein like components are labeled with like numerals, exemplary structures of a semiconductor device, in accordance with embodiments of the present invention are shown and will now be described in greater detail below. The specific number of components depicted in the figures and the cross-section orientation was chosen to best illustrate the various embodiments described herein.

Figure 1:
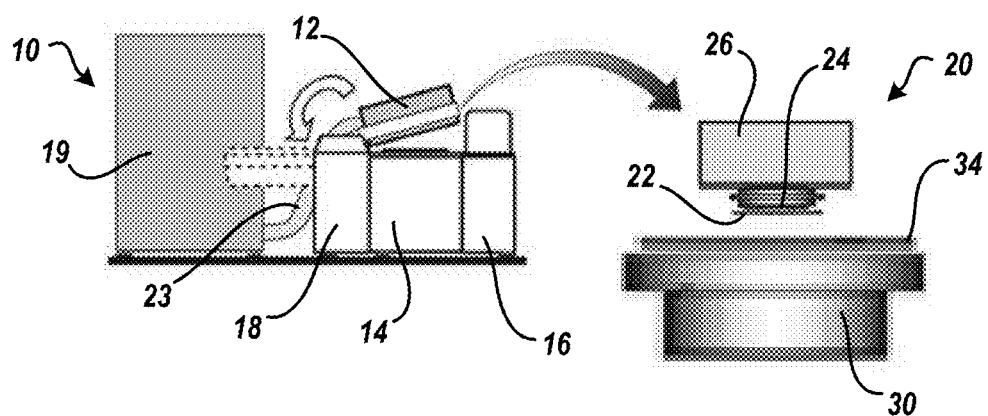
FIG. 1 depicts views of an exemplary IC device tester which may implement one or embodiments of the present invention.

FIG. 1 depicts views of an exemplary IC device tester 10 which may implement one or embodiments of the present invention. IC device tester 10 may include a head assembly housing 12, a wafer chuck housing 14, a wafer housing 16, a wafer housing 18, an analyzer 19, and a cable 23. Head assembly housing 12 may be rotatable relative to wafer chuck housing 14, wafer housing 16, a wafer housing 18. Head assembly housing 12 includes head assembly 20. Wafer chuck housing 14 includes wafer chuck 30 and may also include a robotic arm that moves a wafer 34 from wafer housing 16 to wafer chuck 30 and from wafer chuck 30 to wafer housing 18.

Head assembly 20 may include a probe card 22, a probe head 24, and a head body 26. To conduct a test of wafer 34, probe needles of the probe card 22 electrically contact wafer 34 contacts. The head assembly 20 may be moveably relative to wafer chuck 30. As such, the probe card 22 may test one die of wafer 34 and, subsequently, wafer chuck 30 may move and the probe card 22 may test a different die of wafer 34. Probe head 24 electrically connects the probe card 22 to the head body 26.

Test signals from the IC device tester 10 are transmitted from the analyzer 19 by cable 23 to the head body 26. These test signals are then transferred from the head body 26 to the probe head 24, to the probe card 22, to the probe needles of probe card 22, and ultimately to the contacts of wafer 34. The test signals are then returned from wafer 34 to analyzer 19 for analysis.

Once the test of the wafer 34 is completed, the tested wafer 34 may be moved into wafer housing 18, and a new wafer may be moved from wafer housing 16 to chuck 30 for testing.

Figure 2:
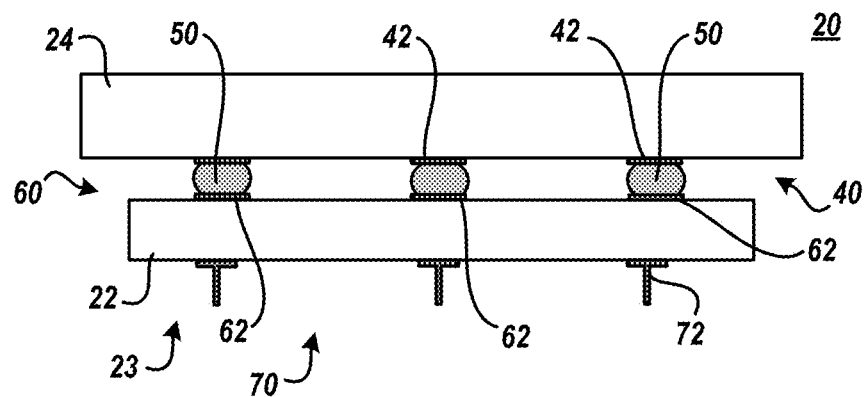
FIG. 2 depicts a cross section view of exemplary head assembly components of an IC device tester, in accordance with one or more embodiments of the present invention.

FIG. 2 depicts a cross section view of head assembly 20 components of an exemplary IC device tester 10, in accordance with one or more embodiments of the present invention. More specifically, FIG. 2 depicts probe card 22 and probe head 24. Probe head 24 may include a contact grid 40 of contacts 42. Grid 40 may be organized into rows and columns of contacts 42. Grid 40 may be a square matrix of contacts 42.

Probe card 22 may include a contact grid 60 of contacts 62. Grid 60 may be organized into rows and columns of contacts 62. Grid 60 may be a square matrix of contacts 62. Grid 40 of contacts 42 may be electrically connected to the grid 60 of contacts 62 by interconnects 50. For example, a grid of interconnects 50 may electrically connect grid 40 and grid 60, as one interconnect 50 electrically connects one contact 42 with one contact 62. Interconnects 50 may be solder, pins, fuzzy buttons, posts, or the like.

Probe card 22 includes an IC device facing surface 23 that includes a grid 70 of probe needles 72. Grid 70 may be organized into rows and columns of contacts 72. Grid 70 may be a square matrix of probe needles 72. Grid 70 of probe needles 72 may be electrically connected to grid 60 of contacts 62 by internal wiring within probe card 22. Probe needles 72 may be formed upon probe card 22 by known fabrication techniques and may be formed from a conductive material, such as metal. In a particular embodiment, probe needles 72 may be formed from copper.

In other implementations, as opposed to the probe needles 72 being connected to probe card 22, IC device tester 10 may rather include movable appendage like probe needles connected to the head body 26, as is known in the art.

Electrical pathways, that may be isolated relative to each other, exists from the analyzer 19, through cable 23, through the head body 26, through to a probe needle 72. The test signals may be sent from analyzer 19 to wafer 34 and returned from the wafer 34 to analyzer 19 via the associated pathway(s).

Figure 3:
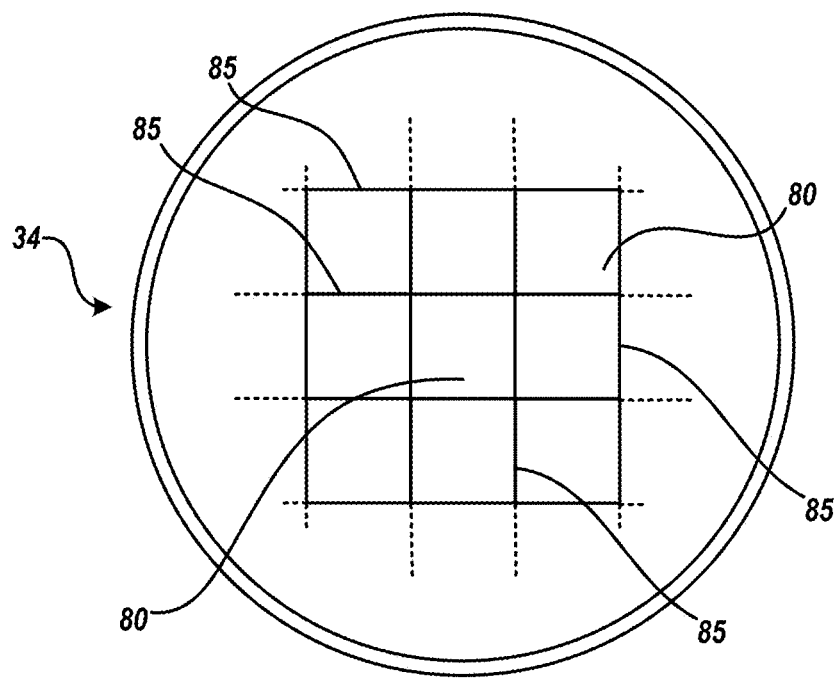
FIG. 3 depicts a normal view of a wafer, in accordance with one or more embodiments of the present invention.

FIG. 3 depicts a normal view of wafer 34, in accordance with one or more embodiments of the present invention. Wafer 34 may include a plurality of dies 80 separated by kerfs 85. Each die 80 may include an active region, wherein integrated circuit devices, microelectronic devices, etc. may be built using microfabrication process steps such as doping or ion implantation, etching, deposition of various materials, photolithographic patterning, electroplating, etc.

Figure 4:
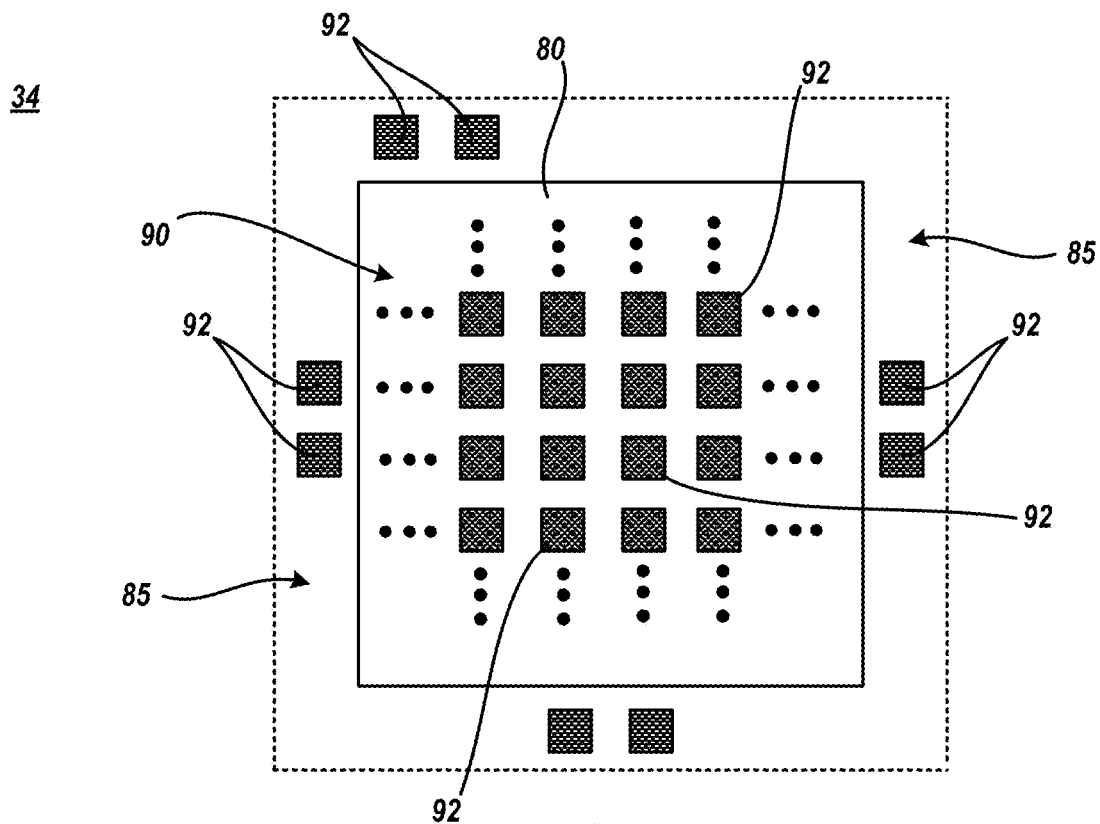
FIG. 4 depicts a detailed normal view of a wafer, in accordance with one or more embodiments of the present invention.

FIG. 4 depicts a detailed normal view of a kerf 85 and a die 80 of wafer 34, in accordance with one or more embodiments of the present invention. Each die 80 includes a grid 90 of contacts 92. Grid 90 may be organized into rows and columns of contacts 92. Grid 90 may be a square matrix of contacts 92. Though an exemplary number of contacts 92 are depicted, a greater or lesser number of contacts 92 may be included upon each die 80. Contacts 92 are generally formed of conductive material, such as Copper, as is known in the art. Controlled collapse chip connection (C4) material, such as solder, or the like, may form a top surface of each contact 92. There may also be contacts 92 formed within the kerf 85 of the wafer 34. Each contact 92 may be electrically connected to one or more electrical pathways, micro devices, such as transistors, etc., and/or the like, that are within wafer 34, as is known in the art. Kerf 85 is generally the area of the wafer 34 that separate each die 80. A saw or other cutting device may cut wafer 34 at the kerf 85 to separate the dies 80 from wafer 34.

Figure 5:
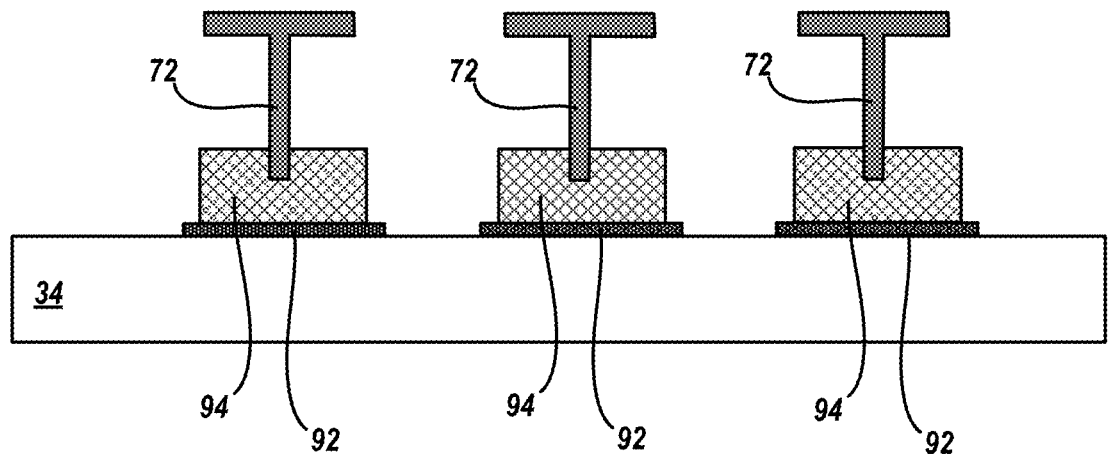
FIG. 5 depicts a cross section view of IC device tester needles in electrical contact with IC device contacts, in accordance with one or more embodiments of the present invention.

FIG. 5 depicts a cross section view of probe needles 72 in electrical contact with contacts 92, in accordance with one or more embodiments of the present invention. To test the die 80 and/or wafer 34, the head assembly 20 moves the probe needles 72 such that the contacts 90 are aligned with probe needles 72. Subsequently, the probe needles 72 are forced into and contact the viscoelastic pad 94 that is formed upon the associated contact 92. That is, the probe needle 72 may be electrically connected to the contact 92 without direct contact thereto since the probe needle 72 may be probed into the viscoelastic pad 94 that is in contact with the contact 92.

A first test signal may be sent from analyzer 19 by way of a first electrical pathway to a first probe needle 72 and into the contact 92 by way of the associated electrically connected viscoelastic pad 94. The first test signal may cross one or more integrated circuit devices, microelectronic devices, or the like, within wafer 34, thereby becoming a first return signal. The first test return signal may be received by analyzer 19 by way of the first electrical pathway from the first probe needle 72 or from a different electrical pathway associated with a probe needle 72 different from the first probe needle 72. A second test signal may be sent from analyzer 19 by way of a second electrical pathway to a second probe needle 72 and into another contact 92 of wafer 34 by way of the associated electrically connected viscoelastic pad 94. The second test signal may cross one or more integrated circuit devices, microelectronic devices, or the like, within wafer 34, thereby becoming a second return signal. The second test return signal may be received by analyzer 19 by way of the second electrical pathway from the second probe needle 72 or from a different pathway associated with a probe needle 72 different from the second probe needle 72. The first test signal and the second test signal may be sent and/or received by or from analyzer 19 simultaneously.

Figure 6:
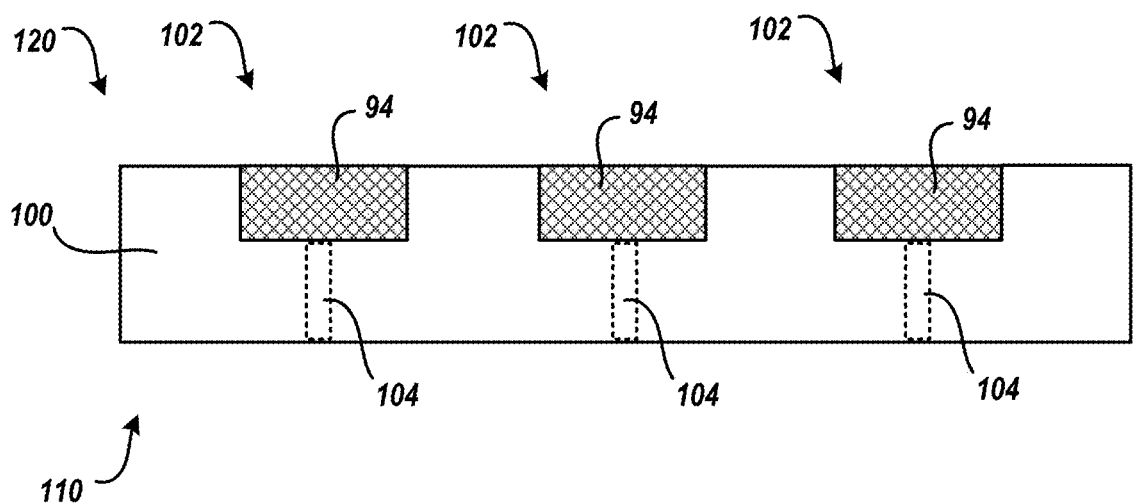
FIG. 6-FIG. 10 depict cross section views of various fabrication stages of embodiments of the present invention.
Figure 7:
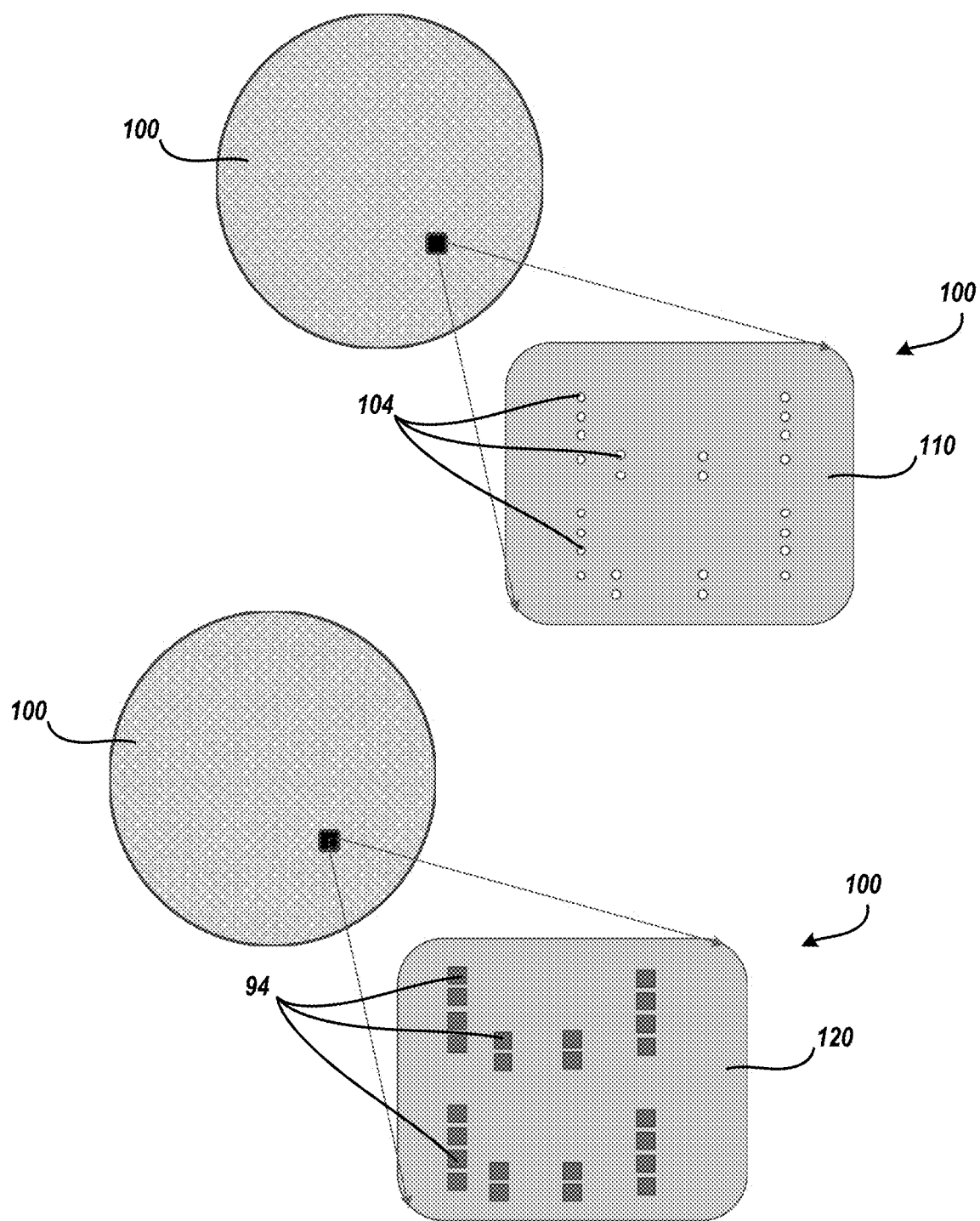

FIG. 6 depicts a cross section view of a fabrication stage of one or more embodiments of the present invention. FIG. 7 depicts a normal view of the fabrication stage. In the present fabrication stage, a viscoelastic pad 94 is formed within a pad recess 102 of a mask 100.

Viscoelastic pad 94 is a formed viscoelastic material that has sufficient viscosity to hold its shape upon contact 92; that has sufficient elasticity for the viscoelastic material to deform around and contact needle 72 when needle 72 is inserted therein and to substantially or semi return to its non-deformed shape when needle 72 is removed therefrom; that has sufficient electrical conductivity and electrical signal integrity to transfer an electrical signal from/to needle 72 to/from contact 92 with minimal or an acceptable degradation of the signal thereacross; and that is non-reactive with wafer 34 surface materials (i.e. Copper, SiN, SiO$_2$, and the like).

A non-exhaustive list of exemplary viscoelastic materials are: electrically conductive elastomers, electrically conductive gels, electrically conductive waxes, electrically conductive epoxies, or the like. For example, viscoelastic pad 94 may be formed of Paraffin wax with Carbon nanotubes therein, an elastomer with metallic particles therein, or the like.

Mask 100 is a patterned structure that includes pockets or recesses 102 therewith. The recesses 102 are located within mask 100 to generally match a predetermined pattern of contacts 92 of wafer 34. The recesses 102 are generally open to IC device facing surface 120 of mask 100. Mask 100 may also include a passage or conduit 104 therein within associated with each recess 102. Conduit 104 is open to handler side 110 of mask 100 and is open to an associated recess 102. Each conduit 104 may be connected to a pressurized air source and/or vacuumed source. Pressurized air may be forced from each conduit 104 into each recess 102 to eject the viscoelastic pad 94 that is formed therein.

Mask 100 may include or may be connected to a heat source. Heating of the mask 100 may alter the properties of the viscoelastic pad 94 material. For example, the viscoelastic pad 94 material may be cured (i.e. polymers within the viscoelastic material crosslink) or melted by heating the mask 100, etc.

Mask 100 may be formed of a material that is generally non-reactive with wafer 34 surface materials. For example, mask 100 may be formed from Silicon, glass, ceramic, or the like.

The viscoelastic pad 94 may formed within pad recess 102 by forming a blanket layer of viscoelastic material within each recess 102 and upon the IC device facing surface 120 of mask 100 and subsequently removing excess viscoelastic material from IC device facing surface 120 such that viscoelastic material is retained within each recess 102. In this embodiment, each recess 102 corresponds to a pattern of predefined contacts 92 of wafer 34. Alternatively, viscoelastic pad 94 may formed within pad recess 102 by depositing, applying, injecting, printing, or the like, viscoelastic material within one or more predefined recesses 102 that correspond with a pattern of predefined contacts 92 of wafer 34. In this embodiment, not all recesses 102 may have viscoelastic material formed there within.

In some implementations, the viscoelastic pad(s) 94 may be cured, melted, and/or shaped prior to their ejection onto the IC device. For example, mask 100 may be heated, placed in oven, or the like to cure or melt the viscoelastic material prior to aligning the mask 100 with the IC device and prior to ejecting the viscoelastic pad(s) 94 onto the IC device.

Subsequent to the testing and/or probing of viscoelastic pad(s) 94 by needles 72, mask 100 may further remove the viscoelastic pad(s) 94 from wafer 34. For example, one or more recesses 102 may be aligned over the viscoelastic pad(s) 94 that are upon wafer 34. The mask 100 may be lowered upon or near the wafer 34 and a vacuum may be formed within each recess 102 by forcing air from each recess 102 into the associated conduit 104 in order to pull away viscoelastic pad(s) 94 material from the wafer 34.

For clarity, mask 100 may be approximately the diameter of wafer 34. Alternatively, mask 100 may be approximately the width/depth or diameter of die 80. Still, mask 100 may be approximately the width/depth of die 80 plus two times the width of a single kerf 85.

Figure 8:
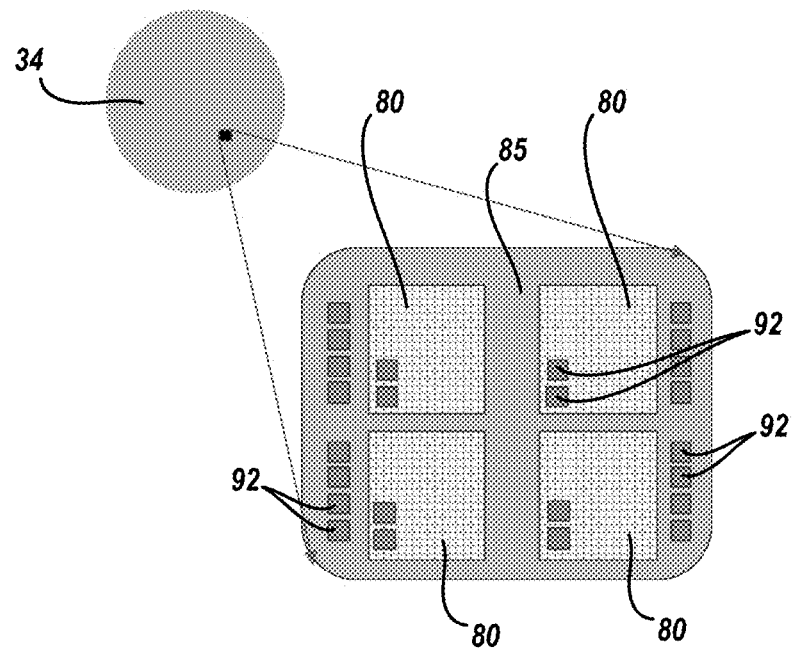
Figure 8:
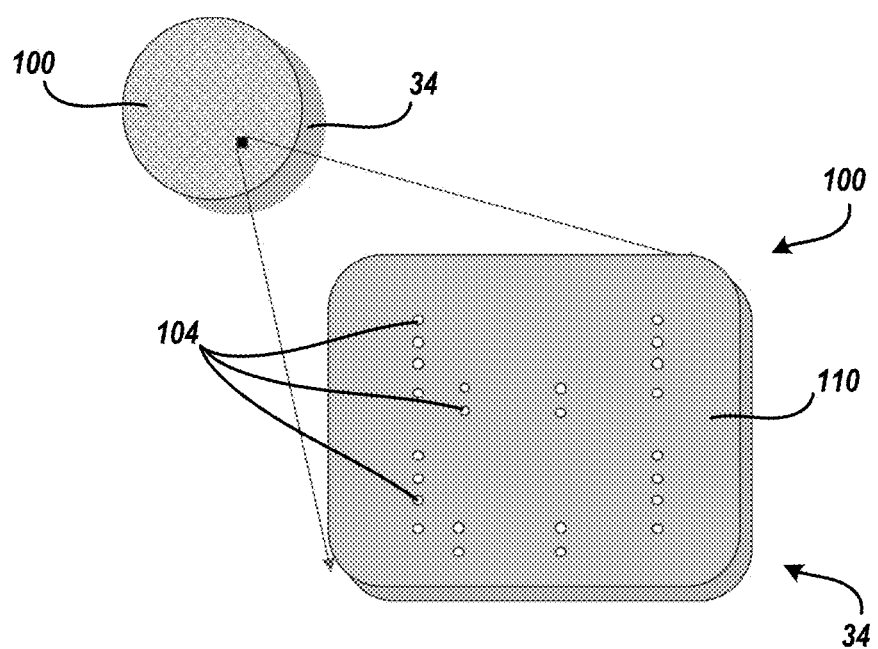

FIG. 8 depicts a cross section view of a fabrication stage of one or more embodiments of the present invention. In the present fabrication stage, mask 100 is aligned with the IC device, such as wafer 34.

Mask 100 may be aligned with wafer 34 by facing IC device facing surface 120 of mask 100 toward and parallel with wafer 34 and positioning the mask 100 over wafer 34 such that the pattern of viscoelastic pad(s) 94 are directly above the pattern of contacts 92. For example, each viscoelastic pad 94 axis of symmetry, each perpendicular to surface 120 of mask 100, is coincident with an associated contact 92 axis of symmetry that is perpendicular to wafer 34.

Figure 9:
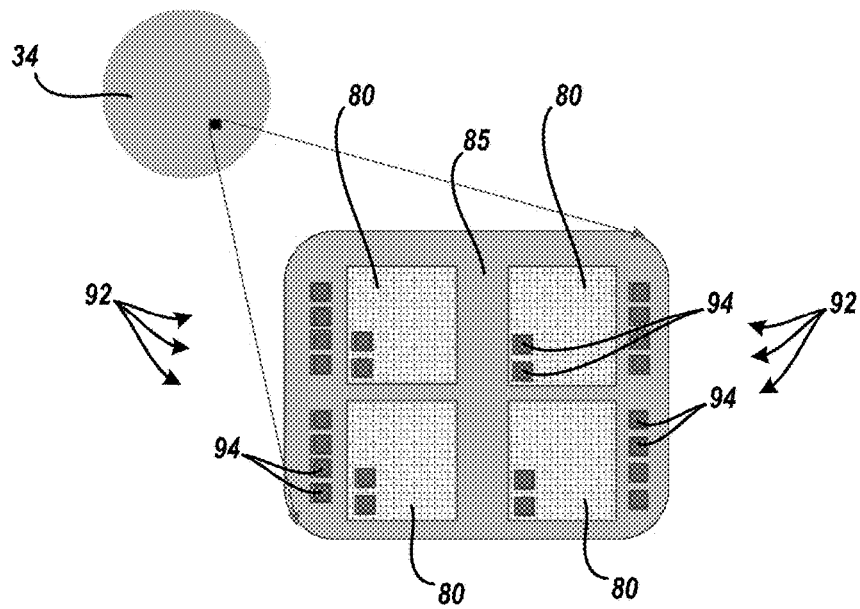

FIG. 9 depicts a cross section view of a fabrication stage of one or more embodiments of the present invention. In the present fabrication stage, each viscoelastic pad(s) 94 is ejected from mask 100 onto a contact 92 of the IC device.

Each viscoelastic pad(s) 94 may be ejected from mask 100 onto a contact 92 of the IC device by forcing air into each associated conduit 104 from the handler side 110 of mask 100. For example, surface 120 of mask 100 may be positioned downward to contact wafer 34 or to be near wafer 34. A pressurized gas, air, etc. source may force gas into each conduit forcing the viscoelastic pad(s) 94 onto the contact 92 to which it is aligned. A vacuum may be formed within recess 102 to remove residual viscoelastic pad 94 material by a vacuum source forcing air from recess 102 into the associated conduit 104.

In some implementations, the viscoelastic pad(s) 94 may be cured or melted subsequent to their ejection onto the IC device. For example, wafer 34 may be heated, placed in oven, or the like to cure or melt the viscoelastic material that is upon the contacts 92 of the IC device.

The width/depth and/or diameter of viscoelastic pad 94 may be the same as the underlying contact 92. For example, sidewall(s) of contact 92 may be coplanar with associated sidewall(s) of viscoelastic pad 94 thereupon. The width/depth and/or diameter of viscoelastic pad 94 may be less than the underlying contact 92. For example, sidewall(s) of viscoelastic pad 94 may be inset from the associated sidewall(s) of contact 92.

Figure 10:
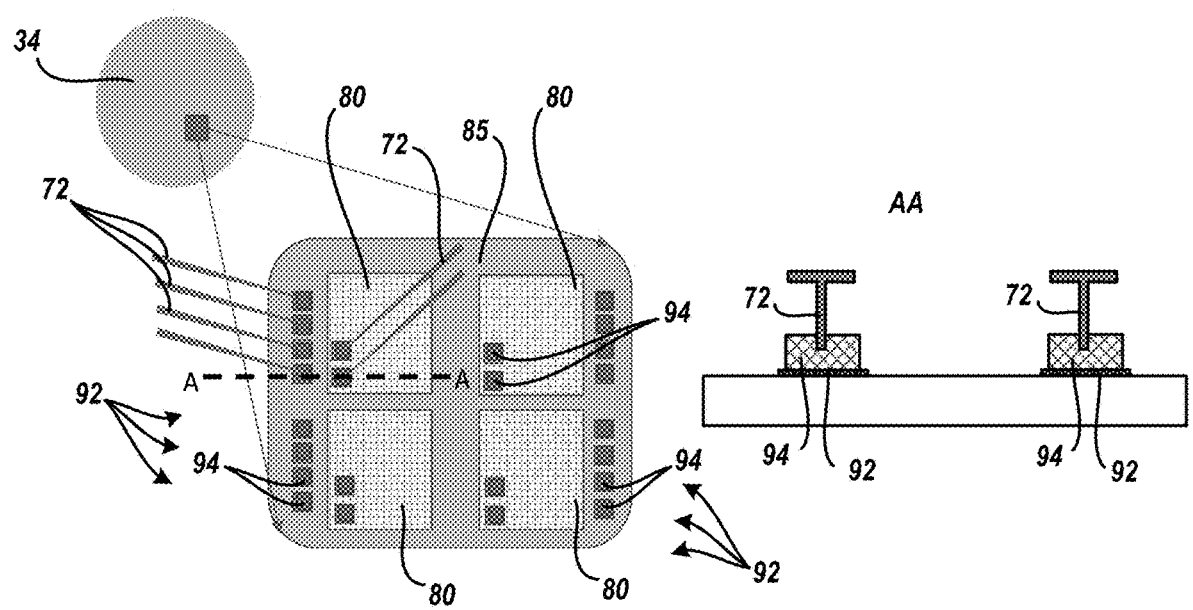

FIG. 10 depicts a cross section view of a fabrication stage of one or more embodiments of the present invention. In the present fabrication stage, probe needle 72 is inserted into viscoelastic pad 94 and is electrically connected to the underlying contact 92 without probe needle 72 directly contacting the contact 92.

For example, probe needles 72 are moved to be in line with respective viscoelastic pad 94 and each needle 72 is forced into and contacts the associated viscoelastic pad 94.

Figure 11:
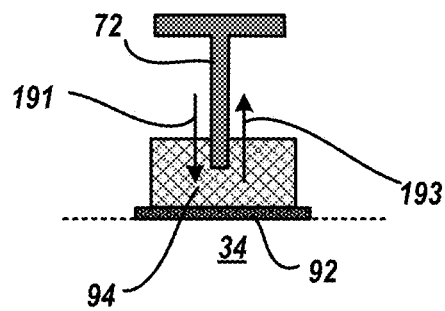
FIG. 11 depicts a cross section view of an IC device tester needle in electrical contact with an IC device contact, in accordance with one or more embodiments of the present invention.

FIG. 11 depicts a cross section view of probe needle 72 in electrical contact with an IC device contact 92, in accordance with one or more embodiments of the present invention.

An input signal 191 may be sent from analyzer 19 to probe needle 72 and into the contact 92 by way of the associated viscoelastic pad 94. The signal 191 may cross one or more IC micro circuits, devices, or the like, within wafer 34, thereby becoming return signal 193. The return signal 193 may be received by analyzer 19 from the probe needle 72 or from a different probe needle 72.

Figure 12:
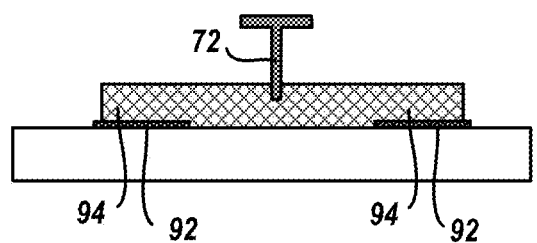
FIG. 12 depicts a cross section view of an IC device tester needle in electrical contact with multiple IC device contacts, in accordance with one or more embodiments of the present invention.

FIG. 12 depicts a cross section view probe needle 72 in electrical contact with multiple IC device contacts 92, in accordance with one or more embodiments of the present invention. In some implementations, mask 100 may be configured such that an opening 102 is sized to correspond with two contact 92 locations. As a result, a single viscoelastic pad 94 may be ejected upon multiple (e.g., neighboring, or the like) contacts 92 and upon the IC device therebetween. Probe needle 72 may be inserted into the viscoelastic pad 94 to be in electrical contact with the multiple contacts 92.

Figure 13:
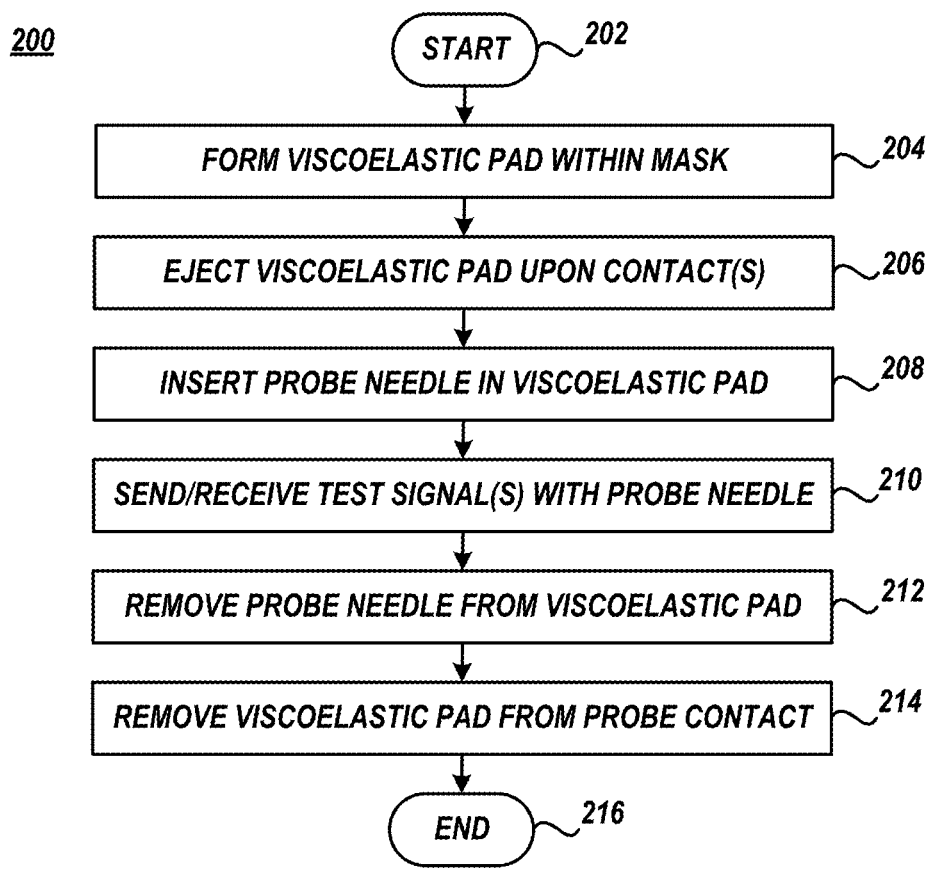
FIG. 13 depicts an exemplary method of fabricating a viscoelastic pad upon an IC device contact and/or conducting an electrical characterization probe test of the IC device, in accordance with one or more embodiments of the present invention.

FIG. 13 depicts an exemplary method 200 of fabricating viscoelastic pad 94 upon an IC device contact 92 and/or conducting an electrical characterization probe test of the IC device, in accordance with one or more embodiments of the present invention. Method 200 may be utilized to fabricate an IC device, such as a die 80 and/or a wafer 34 and/or may be utilized to conduct an electrical characterization probe test of the IC device.

Method 200 begins at block 202 and continues with forming a viscoelastic pad 94 within mask 100 (block 204). For example, viscoelastic pad 94 may formed within pad recess 102 by forming a blanket layer of viscoelastic material within each recess 102 and upon the IC device facing surface 120 of mask 100 and subsequently removing excess viscoelastic material from IC device facing surface 120 such that viscoelastic material is retained within each recess 102. Viscoelastic pad 94 may also be formed within pad recess 102 by depositing, applying, injecting, printing, or the like, viscoelastic material within one or more predefined recesses 102 that correspond with a pattern of predefined contacts 92 of wafer 34.

Method 200 may continue with ejecting the viscoelastic pad 94 from mask 100 onto one or more aligned IC device contact(s) 92 (block 206). Viscoelastic pad 94 may be aligned with contact 92 by facing IC device facing surface 120 of mask 100 toward and parallel with wafer 34 and positioning the mask 100 over wafer 34 such that the viscoelastic pad(s) 94 are directly above the contact(s) 92. In other words, a viscoelastic pad 94 axis of symmetry that is perpendicular to surface 120 of mask 100, is coincident with an associated contact 92 axis of symmetry that is perpendicular to the contact surface of the IC device.

The viscoelastic pad 94 may be ejected from mask 100 onto contact(s) 92 of the IC device by forcing a gas into the associated conduit 104 from the handler side 110 of mask 100. For example, surface 120 of mask 100 may be positioned downward and may contact wafer 34 or may be parallel and near wafer 34. A pressurized gas, air, etc. source may force gas into each conduit forcing the viscoelastic pad(s) 94 out of the recess 102 and onto the contact 92 to which it is aligned.

In various instances, the viscoelastic pad 94 may be cured or melted prior to being ejected on the IC device or may be cured or melted after being ejected onto the IC device.

Method 200 may continue with inserting probe needle 72 into the viscoelastic pad 94 (block 208). The probe needle 72 is inserted into the viscoelastic pad 94 without directly contacting the underlying contact 92. As the viscoelastic pad 94 is electrically conductive, the probe pin 92 is electrically connected with the contact 92 by way of the viscoelastic pad 94.

Method 200 may continue with conducing an electrical characterization probe test of the IC device by sending electrical input signal(s) to the contact 92 by way of the probe needle 72 and viscoelastic pad 94 and receiving electrical return signal(s) from the contact 92 by way of the probe needle 72 and viscoelastic pad 94 (block 210). For example, analyzer 19 may send an input signal 191 via an electrical pathway to probe needle 72 and into the contact 92 by way of the associated viscoelastic pad 94. The signal 191 may cross one or more IC micro circuits, devices, or the like, within the IC device, thereby becoming return signal 193. The return signal 193 may be received by analyzer 19 from the probe needle 72 and its associated electrical pathway or from a different probe needle 72 and its associated electrical pathway.

Method 200 may continue with removing the probe needle from the viscoelastic pad 94 (block 212). For example, the probe needle 72 is forced away from the viscoelastic pad 94 and the viscoelastic pad 94 may return to its un-probed shape. In some embodiments, blocks 210 and 212 may be repeated as is necessary to adequately electrically characterize the associated IC device. That is, the viscoelastic pad 94 has adequate elasticity and resiliency to accept multiple insertions/removal cycles of probe needle 72.

Upon the adequate electrical characterization of the IC device, the viscoelastic pad 94 may be removed from the contact 92 (block 214). For example, the pattern of viscoelastic pads 94 upon respective contacts 92 of the IC device may be cleaned from the IC device. In an implementation, one or more recesses 102 may be aligned over the viscoelastic pad(s) 94 that are upon wafer 34. The mask 100 may be lowered upon or near the wafer 34 and a vacuum may be formed within each recess 102 by forcing air from each recess 102 into the associated conduit 104 in order to pull away viscoelastic pad(s) 94 material from the wafer 34. Method 200 may bed at block 216.

Embodiment(s) of the present invention are directed to system(s) and/or method(s) that provide a viscoelastic pad contact interface that allows for multiple or repeated electrical testing and/or characterization probing cycles of an IC device. These embodiment(s) allow for tests and follow-up tests with minimal degradation of test capability of the IC device and minimal degradation of the IC device contact due to limited or no direct needle contact with the IC device contacts. Embodiment(s) of the present invention are directed to system(s) and/or method(s) that provide for a structure to form viscoelastic pads upon contacts of an IC device. Embodiment(s) of the present invention allow for non-direct contact of probe needle to the probe contact which delays the degradation of the probe needle and prolongs probe head life. Other embodiment(s) are directed to features as are described herein.

The accompanying figures and this description depicted and described embodiments of the present invention, and features and components thereof. Those skilled in the art will appreciate that any nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as may be used herein is defined as a plane parallel to the conventional plane or surface of the IC device that contains contacts that are or may be probed, regardless of the actual spatial orientation of the IC device. The term "vertical" refers to a direction perpendicular to the horizontal, as just defined. Terms, such as "on", "above", "below", "side" (as in "sidewall"), "higher", "lower", "over", "beneath," "under", "top," "bottom," "left," "right," or the like, are used with respect to the horizontal plane. It is understood that various other frames of reference may be employed for describing the present invention without departing from the spirit and scope of the present invention.

What is claimed is:

1. A method of testing an integrated circuit (IC) device, the method comprising:
    ejecting a viscoelastic pad from a recess of a mask onto a contact of the IC device;
    inserting a probe needle into the viscoelastic pad without contacting the probe needle with the contact;
    passing an incoming electrical signal from the probe needle though the viscoelastic pad to the contact;
    receiving a return electrical signal from the contact though the viscoelastic pad to the probe needle;
    removing the probe needle from the viscoelastic pad; and
    removing the viscoelastic pad from the contact of the IC device.

2. The method of claim 1, wherein the IC device is a wafer.

3. The method of claim 1, wherein the IC device is a die.

4. The method of claim 1, wherein the viscoelastic pad comprises a viscoelastic material and an electrically conductive material.

5. The method of claim 1, wherein the viscoelastic pad comprises a wax with Carbon nanotubes therein.

6. A method of fabricating an integrated circuit (IC) device, the method comprising:
    forming a viscoelastic pad within a recess of a mask;
    aligning the viscoelastic pad within the mask with a contact of the IC device;
    ejecting the viscoelastic pad from the recess of the mask and onto the aligned contact of the IC device;
    inserting a probe needle into the ejected viscoelastic pad without contacting the probe needle with the contact;
    passing an incoming electrical signal from the probe needle though the viscoelastic pad to the contact;
    receiving a return electrical signal from the contact though the viscoelastic pad to the probe needle;
    removing the probe needle from the viscoelastic pad; and
    removing the viscoelastic pad from the contact of the IC device.

7. The method of claim 6, further comprising:
    curing or melting the viscoelastic material of the viscoelastic pad.

8. The method of claim 6, wherein ejecting the viscoelastic pad from the recess of the mask and onto the aligned contact of the IC device comprises:
    forcing a gas into the recess.

9. The method of claim 6, wherein the IC device is a wafer.

10. The method of claim 9, wherein the contact of the IC device is located within a kerf of the wafer.

11. The method of claim 6, wherein the IC device is a die.

12. The method of claim 6, wherein the viscoelastic pad comprises a viscoelastic material and an electrically conductive material.

13. The method of claim 6, wherein the viscoelastic pad comprises a wax with Carbon nanotubes therein.

14. A system to test an integrated circuit (IC) device, the system comprising:
    a mask comprising a recess and a viscoelastic pad within the recess, the mask configured to eject the viscoelastic pad from the recess onto a contact of an IC device;
    the IC device comprising a contact and the viscoelastic pad directly upon the contact; and
    a probe needle configured to insert into the viscoelastic pad without contacting the contact, configured to pass an incoming electrical signal though the viscoelastic pad to the contact, and configured to receive a return electrical signal from the contact though the viscoelastic pad.

15. The system of claim 14, wherein the IC device is a wafer.

16. The system of claim 15, wherein the contact of the IC device is located within a kerf of the wafer.

17. The system of claim 15, wherein the contact of the IC device is located within an active region of the wafer.

18. The system of claim 14, wherein the IC device is a die.

19. The system of claim 14, wherein the viscoelastic pad comprises a viscoelastic material and an electrically conductive material.

20. The system of claim 14, wherein the viscoelastic pad comprises a wax with Carbon nanotubes therein.

* * * * *